（12） United States Patent
Nakamura (10) Patent No.: US 10,453,674 B2
(45) Date of Patent: Oct. 22, 2019

(54) SUBSTRATE TREATMENT METHOD AND SUBSTRATE TREATMENT DEVICE (71) Applicant: SCREEN Holdings Co., Ltd., Kyoto (JP)

(72) Inventor: Kazuki Nakamura, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 89 days.

(21) Appl. No.: 15/744,947

(22) PCT Filed: Apr. 21, 2016

(86) PCT No.: PCT/JP2016/062656
§ 371 (c)(1),
(2) Date: Jan. 15, 2018

(87) PCT Pub. No.: WO2017/033495
PCT Pub. Date: Mar. 2, 2017

(65) Prior Publication Data
US 2018/0226244 A1 Aug. 9, 2018

(30) Foreign Application Priority Data
Aug. 25, 2015 (JP) ................... 2015-166099

(51) Int. Cl.
H01L 21/02 (2006.01)
B08B 1/04 (2006.01)
(Continued)

(52) U.S. Cl.
CPC .......... *H01L 21/02087* (2013.01); *B08B 1/04* (2013.01); *H01L 21/6715* (2013.01);
(Continued)

(58) Field of Classification Search
CPC combination set(s) only.
See application file for complete search history.

(56) References Cited

U.S. PATENT DOCUMENTS

2006/0243304 A1 11/2006 Hsu et al. ................... 134/6
2008/0200100 A1 8/2008 Takahashi et al. ......... 451/44
(Continued)

FOREIGN PATENT DOCUMENTS

CN 1848400 A 10/2006
JP H06-045302 A 2/1994
(Continued)

OTHER PUBLICATIONS

International Preliminary Report on Patentability (Chapter I) dated Mar. 8, 2018 with a Notification from the International Bureau (Form PCT/IB/326) in corresponding PCT International Application No. PCT/JP2016/062656 in Japanese.
(Continued)

Primary Examiner — Erin F Bergner
(74) Attorney, Agent, or Firm — Ostrolenk Faber LLP (57) ABSTRACT A brush is moved from a central position to an outer periphery position while the brush is contacted with an upper surface of a substrate being rotated at a first rotational speed. In this way, a flat region of the substrate is scrub-cleansed. Thereafter, the brush is contacted with a bevel region of the substrate being rotated at a second rotational speed lower than the first rotational speed. In this way, the bevel region of the substrate is scrub-cleansed. Thereafter, while the substrate is rotated at a third rotational speed higher than the second rotational speed, the brush is disposed at an overlapping region cleaning position. In this way, an overlapping region of the flat region and the bevel region are scrub-cleansed.

6 Claims, 7 Drawing Sheets (51) Int. Cl.
*H01L 21/67* (2006.01)
*H01L 21/687* (2006.01)

(52) U.S. Cl.
CPC .. *H01L 21/67046* (2013.01); *H01L 21/67051* (2013.01); *H01L 21/68728* (2013.01); *H01L 21/68764* (2013.01); *H01L 21/02096* (2013.01)

(56) References Cited

U.S. PATENT DOCUMENTS

| 2009/0120472 | A1 | 5/2009 | Nishiyama et al. | 134/157 |
| 2014/0373289 | A1 | 12/2014 | Miyazaki et al. | 15/21.1 |
| 2017/0040189 | A1* | 2/2017 | Watanabe | H01L 21/67046 |
| 2017/0092530 | A1* | 3/2017 | Kaba | H01L 21/68785 |

FOREIGN PATENT DOCUMENTS

| JP | 2002-110630 A | 4/2002 |
| JP | 2003-151943 A | 5/2003 |
| JP | 2003-197598 A | 7/2003 |
| JP | 2008-539594 A | 11/2008 |
| JP | 4939376 B2 | 5/2012 |
| TW | 200644140 A | 12/2006 |

OTHER PUBLICATIONS

International Preliminary Report on Patentability (Chapter I) dated Mar. 8, 2018 with a Notification from the International Bureau (Form PCT/IB/338) in corresponding PCT International Application No. PCT/JP2016/062656 in English.

International Search Report dated Aug. 2, 2016 in corresponding PCT International Application No. PCT/JP2016/062656.

Written Opinion dated Aug. 2, 2016 in corresponding PCT International Application No. PCT/JP2016/062656.

* cited by examiner

| | Condition No. | Flat region | Bevel region | Overlapping region |
|---|---|---|---|---|
| Rotational speed of substrate | 1 | 200 rpm or more | 100 rpm or less | 200 rpm or more |
| | 2 | | | 100 rpm or more |
| | 3 | | | 100 to 200 rpm |
| Flow rate of DIW | 1 | 400ml/min | 400ml/min | 400ml/min |
| | 2 | | | 200ml/min |
| | 3 | | | 100ml/min |
| Pressing force of brush | 1 | 50gf | 50gf | 50gf |
| | 2 | | | 30gf |
| | 3 | | | 20gf |
| Contact duration | 1 | 8sec | 1 sec or more | 5 sec or more |
| | 2 | | | 3 sec or more |
| | 3 | | | 1 sec or more |

SUBSTRATE TREATMENT METHOD AND SUBSTRATE TREATMENT DEVICE

CROSS-REFERENCE TO RELATED APPLICATIONS

The present application is a 35 U.S.C. §§ 371 national phase conversion of PCT/JP2016/062656, filed Apr. 21, 2016, which claims priority to Japanese Patent Application No. 2015-166099, filed Aug. 25, 2015, the contents of both of which are incorporated herein by reference. The PCT International Application was published in the Japanese language.

TECHNICAL FIELD

The present invention relates to a substrate processing method and a substrate processing apparatus that process a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

BACKGROUND ART

PATENT DOCUMENT 1 discloses a single substrate processing type substrate processing apparatus that scrub-cleanses a substrate one by one.

The substrate processing apparatus includes a spin chuck that rotates a substrate about the vertical rotation axis passing through a central portion of the substrate while horizontally gripping the substrate with a plurality of chuck pins arranged around the substrate, a brush to be pressed against the substrate held by the spin chuck, and a magnet plate and a magnet elevating/lowering mechanism to separate only some of the chuck pins from the substrate when the spin chuck rotates the substrate. The brush includes an upper surface to be pressed against a lower surface (rear surface) of the substrate, and a drum-shaped outer peripheral surface to be pressed against a bevel portion of the substrate.

PRIOR ART DOCUMENT

Patent Document

PATENT DOCUMENT 1: JP 4939376 B2

SUMMARY OF THE INVENTION

Problem(s) to be Solved by the Invention

In a case where the substrate is gripped by the chuck pins, the brush can be moved outward only to a position where the brush is not abutted with the chuck pins. Thus, the bevel portion of the substrate cannot be scrub-cleansed by a cleaning surface of the brush to be pressed against a front surface or a rear surface of the substrate.

In PATENT DOCUMENT 1, some of the chuck pins can be separated from the rotating substrate. Thus, the upper surface of the brush to be pressed against the lower surface (rear surface) of the substrate may be able to be in contact with the bevel portion of the substrate while avoiding contact between the brush and the chuck pins.

However, when all the chuck pins are not in contact with the substrate, stability to hold the substrate is lowered as compared with a case where all the chuck pins are in contact with the substrate. Thus, a rotational speed of the substrate must be lowered.

According to research of the present inventor, it is found that since relative speed of the substrate and the brush is small when the rotational speed of the substrate is low, particles (for example, minute particles with a grain diameter of about 40 nm) are accumulated and spread between the substrate and the brush and remain in the substrate when the brush is separated from the substrate. Therefore, it is found that there is room for improvement relating to cleanliness of the substrate.

Thus, one object of the present invention is to scrub-cleanse a bevel portion of a substrate with a cleaning surface of a brush to be pressed against a principal surface (a front surface or a rear surface) of the substrate so as to enhance cleanliness of the substrate.

Means for Solving the Problem

A preferred embodiment of the present invention provides a substrate processing method including a first substrate rotation process of rotating a substrate in a horizontal posture at a first rotational speed by rotating a plurality of chuck pins about the vertical rotation axis passing through the substrate while making all the plurality of chuck pins in contact with a bevel portion of the substrate, a flat region cleaning process of cleaning a circular flat region ranging from the center of a principal surface of the substrate to a position around the center by moving a brush within a range where the brush is not in contact with the plurality of chuck pins which are in contact with the bevel portion of the substrate while making a cleaning surface of the brush in contact with the principal surface of the substrate in parallel with the first substrate rotation process, a second substrate rotation process of rotating the substrate in a horizontal posture at a second rotational speed which is smaller than the first rotational speed by rotating the plurality of chuck pins about the rotation axis while making three or more of the plurality of chuck pins in contact with the bevel portion of the substrate and separating the remaining chuck pin from the bevel portion of the substrate after the first substrate rotation process, a bevel region cleaning process of cleaning a bevel region including both an annular overlapping region corresponding to an outer peripheral portion of the flat region and an inclined portion of the principal surface of the substrate by arranging the brush at a position on the inner side of the chuck pins separated from the bevel portion of the substrate, the position being a bevel region cleaning position where the cleaning surface of the brush is in contact with both the overlapping region and the inclined portion of the principal surface of the substrate in parallel with the second substrate rotation process, a third substrate rotation process of rotating the substrate in a horizontal posture at a third rotational speed which is greater than the second rotational speed by rotating the plurality of chuck pins about the rotation axis while making all the plurality of chuck pins in contact with the bevel portion of the substrate after the second substrate rotation process, and an overlapping region cleaning process of cleaning the overlapping region by arranging the brush at an overlapping region cleaning position where the cleaning surface of the brush is in contact with the overlapping region and not in contact with the plurality of chuck pins which are in contact with the bevel portion of the substrate in parallel with the third substrate rotation process.

With this method, all the chuck pins are rotated while making all the chuck pins in contact with the bevel portion of the substrate. Thereby, the substrate is rotated about the rotation axis at the first rotational speed. The cleaning surface of the brush is pressed against the principal surface of the rotating substrate. In this state, the brush is moved along the principal surface of the substrate within the range where the brush is not in contact with the plurality of chuck pins. Thereby, the brush is rubbed onto the circular flat region ranging from the center of the principal surface of the substrate to the position around the center, so that the flat region is scrub-cleansed.

Next, in a state where three or more of the chuck pins are in contact with the bevel portion of the substrate, the remaining chuck pin is separated from the substrate. The rotational speed of the substrate is lowered from the first rotational speed to the second rotational speed. In this state, the brush is arranged at the bevel region cleaning position where the cleaning surface of the brush is in contact with both the annular overlapping region corresponding to the outer peripheral portion of the flat region and the inclined portion of the principal surface of the substrate. Thereby, the bevel region including both the overlapping region and the inclined portion of the principal surface of the substrate is scrub-cleansed. That is, the cleaning surface of the brush is pressed not only against the flat region but also against the bevel region.

Next, all the chuck pins are pressed against the bevel portion of the substrate. The rotational speed of the substrate is increased to the third rotational speed which is greater than the second rotational speed. In this state, the brush is arranged at the overlapping region cleaning position where the cleaning surface of the brush is in contact with the overlapping region and not in contact with the plurality of chuck pins which are in contact with the bevel portion of the substrate. Since the third rotational speed is greater than the second rotational speed, relative speed of the substrate and the brush is increased. Therefore, particles are more reliably removed from the overlapping region.

The overlapping region is a portion of the flat region and a portion of the bevel region. When the flat region is cleaned, the overlapping region is cleaned. Meanwhile, when the bevel region is cleaned, the particles are spread in the overlapping region. This is because the rotational speed of the substrate at the time of cleaning the bevel region is low and the particles are accumulated and spread between the substrate and the brush. Therefore, the particles can be removed from the overlapping region by cleaning the overlapping region while rotating the substrate at high speed after the bevel region is cleaned. Thereby, cleanliness of the substrate can be enhanced.

In the preferred embodiment, at least one of the following features may be added to the substrate processing method.

The overlapping region cleaning process includes a moving process of moving the brush from the bevel region cleaning position to the overlapping region cleaning position without moving the brush to a position on the inner side of the overlapping region cleaning position, and a separation process of separating the brush from the substrate by moving the brush upward or downward from the overlapping region cleaning position.

When the bevel region is cleaned, the particles accumulated between the substrate and the brush are spread in the inclined portion of the principal surface of the substrate and the overlapping region but not easily spread to the region on the inner side of the overlapping region. With this method, a contact region between the substrate and the brush is not moved on the inner side of the overlapping region but the brush is separated from the substrate after the brush is directly moved from the bevel region cleaning position to the overlapping region cleaning position. Therefore, only the region contaminated at the time of cleaning the bevel region (overlapping region) and the vicinity of the region can be efficiently cleaned. Further, in comparison to a case where the entire flat region is cleaned again after the bevel region is cleaned, throughput (the number of the substrates processed per unit time) can be increased.

The flat region cleaning process includes a scanning process of moving the brush only in the direction separating from the rotation axis while making the brush in contact with the principal surface of the substrate.

With this method, when the flat region is cleaned, the brush is moved only in the direction separating from the rotation axis of the substrate while making the brush in contact with the principal surface of the rotating substrate. The particles on the substrate are urged to move outward along the substrate by movement of the brush. Therefore, the particles can be efficiently removed from the substrate, so that the cleanliness of the substrate can be further enhanced.

At least one of the rotational speed of the substrate, pressing force of the brush against the substrate, and a contact duration in which the brush is in contact with the substrate at the time of executing the overlapping region cleaning process is reduced more than that at the time of the flat region cleaning process.

When the bevel region is cleaned, the particles accumulated between the substrate and the brush are spread in the overlapping region. The particles spread in the overlapping region are particles removed from the substrate by the brush, the particles normally having weaker adhesion force to the substrate than that of the particles attached to the substrate before cleaning. Therefore, even when cleaning conditions including the rotational speed of the substrate are weakened, the particles can be removed from the overlapping region. Thereby, the cleanliness of the substrate can be efficiently enhanced.

Another preferred embodiment of the present invention provides a substrate processing method including a second substrate rotation process of rotating a substrate in a horizontal posture at a second rotational speed by rotating a plurality of chuck pins about the vertical rotation axis passing through the substrate while making three or more of the plurality of chuck pins in contact with a bevel portion of the substrate and separating the remaining chuck pin from the bevel portion of the substrate, a bevel region cleaning process of cleaning a bevel region including both an inclined portion of a principal surface of the substrate and an annular overlapping region on the inner side of the inclined portion by arranging a brush at a position on the inner side of the chuck pins separated from the bevel portion of the substrate, the position being a bevel region cleaning position where a cleaning surface of the brush is in contact with both the inclined portion of the principal surface of the substrate and the overlapping region, a first substrate rotation process of rotating the substrate in a horizontal posture at a first rotational speed which is greater than the second rotational speed by rotating the plurality of chuck pins about the rotation axis while making all the plurality of chuck pins in contact with the bevel portion of the substrate after the second substrate rotation process, and a flat region cleaning process of cleaning a circular flat region ranging from the center of the principal surface of the substrate to the overlapping region by moving the brush between a central position where the cleaning surface of the brush is in contact with the center of the principal surface of the substrate and an outer periphery position where the cleaning surface of the brush is in contact with the overlapping region and not in contact with the plurality of chuck pins which are in contact with the bevel portion of the substrate in parallel with the first substrate rotationprocess.

With this method, all the chuck pins are rotated while making three or more of the chuck pins in contact with the bevel portion of the substrate and separating the remaining chuck pin from the bevel portion of the substrate. Thereby, the substrate is rotated about the rotation axis at the second rotational speed. In this state, the brush is arranged at the bevel region cleaning position where the cleaning surface of the brush is in contact with both the inclined portion of the principal surface of the substrate and the annular overlapping region on the inner side of the inclined portion. Thereby, the brush is rubbed onto the bevel region including both the overlapping region and the inclined portion of the principal surface of the substrate, so that the bevel region is scrub-cleansed.

Next, all the chuck pins are pressed against the bevel portion of the substrate. The rotational speed of the substrate is increased to the first rotational speed which is greater than the second rotational speed. In this state, the brush is moved between the central position where the cleaning surface of the brush is in contact with the center of the principal surface of the substrate and the outer periphery position where the cleaning surface of the brush is in contact with the overlapping region and not in contact with the plurality of chuck pins which are in contact with the bevel portion of the substrate. Thereby, the circular flat region ranging from the center of the principal surface of the substrate to the position around the center is scrub-cleansed. That is, the cleaning surface of the brush is pressed not only against the bevel region but also against the flat region.

The overlapping region is a portion of the flat region and a portion of the bevel region. When the bevel region is cleaned after the flat region is cleaned, the particles remain in the overlapping region. This is because the rotational speed of the substrate at the time of cleaning the bevel region is low and the particles are accumulated and spread between the substrate and the brush. Therefore, the particles can be removed from the overlapping region by cleaning the flat region while rotating the substrate at high speed after the bevel region is cleaned. Thereby, the cleanliness of the substrate can be enhanced. Further, since the particles spread in the overlapping region can be removed while cleaning the entire flat region, a cleaning time can be shortened.

Still another preferred embodiment of the present invention provides a substrate processing apparatus including a spin chuck including a plurality of chuck pins arranged around a substrate, a chuck opening/closing mechanism that moves three or more of the plurality of chuck pins and the remaining chuck pin independently between a closing position where the chuck pin is in contact with a bevel portion of the substrate and an opening position where the chuck pin is separated from the bevel portion of the substrate, and a spin motor that rotates the plurality of chuck pins about the vertical rotation axis passing through the substrate, a brush including a cleaning surface to be pressed against the substrate horizontally held by the spin chuck, a brush movement mechanism that moves the brush, and a controller that executes any of the substrate processing methods described above by controlling the spin chuck and the brush movement mechanism. With this configuration, the effects described above can be obtained.

The above and other objects, features, and effects of the present invention will become more apparent from the following detailed description of the preferred embodiments with reference to the attached drawings.

DESCRIPTION OF PREFERRED EMBODIMENTS

Figure 1:
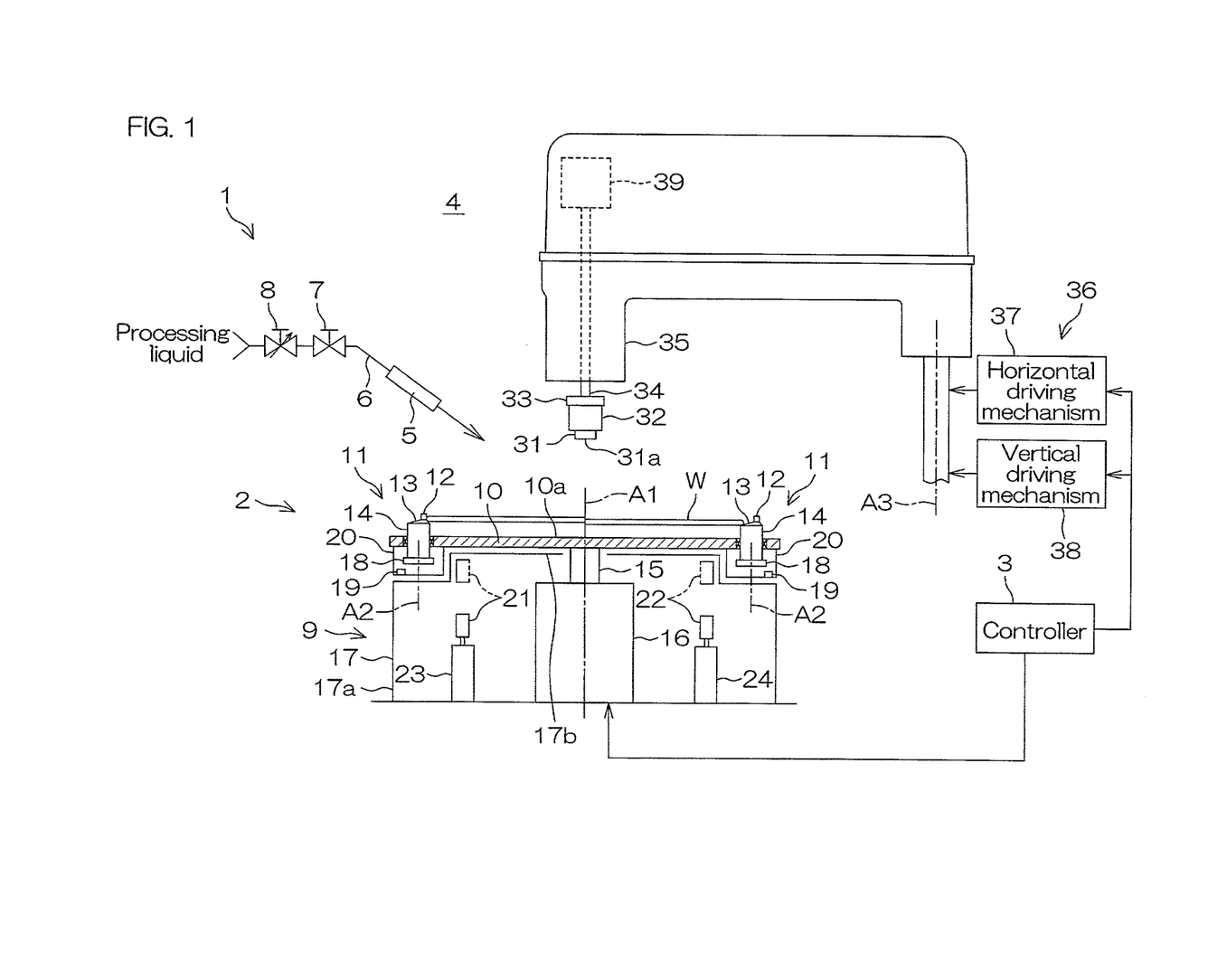
FIG. 1 is a schematic view of the interior of a processing unit included in a substrate processing apparatus according to a preferred embodiment of the present invention when viewed horizontally.
Figure 2:
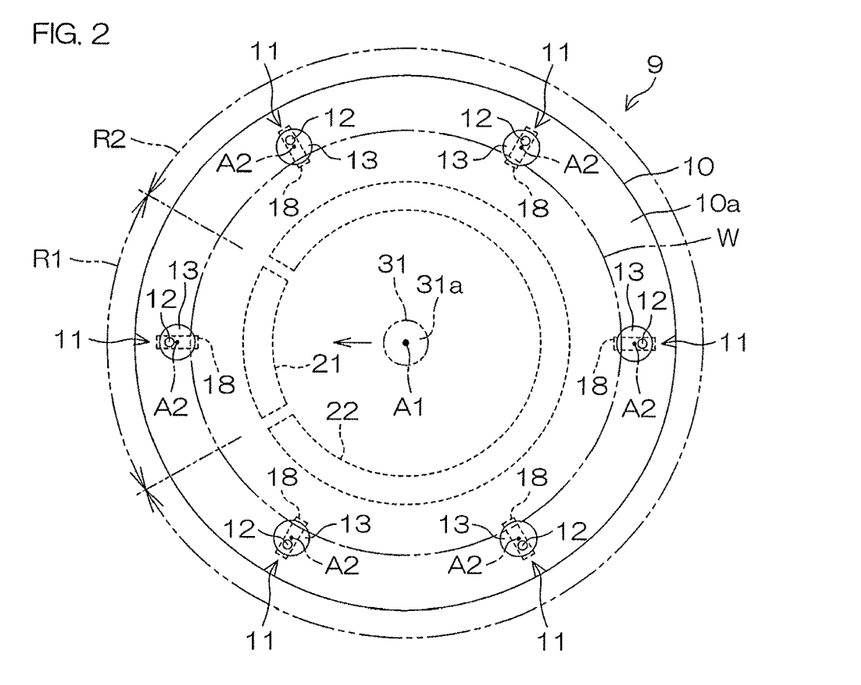
FIG. 2 is a schematic view of a spin chuck included in the processing unit when viewed from above.

FIG. 1 is a schematic view of the interior of a processing unit 2 included in a substrate processing apparatus 1 according to a preferred embodiment of the present invention when viewed horizontally. FIG. 2 is a schematic view of a spin chuck 9 included in the processing unit 2 when viewed from above.

In FIG. 1, the right side of the rotation axis A1 shows a state where a chuck pin 11 is placed at an opening position, and the left side of the rotation axis A1 shows a state where a chuck pin 11 is placed at a closing position. FIG. 2 shows a state where all the chuck pins 11 are placed at the opening position.

As shown in FIG. 1, the substrate processing apparatus 1 is a single substrate processing type apparatus that processes disk-shaped substrates W such as semiconductor wafers one by one. The substrate processing apparatus 1 includes the processing unit 2 that processes the substrate W with a processing fluid such as a processing liquid and a processing gas, a transfer robot (not shown) that transfers the substrate W to the processing unit 2, and a controller 3 that controls the substrate processing apparatus 1. The controller 3 is a computer including an arithmetic portion and a storage portion.

The processing unit 2 includes a box-shaped chamber 4 having an internal space, the spin chuck 9 that rotates the substrate W about the vertical rotation axis A1 passing through a central portion of the substrate W while horizontally holding the substrate in the chamber 4, and a processing liquid nozzle 5 that discharges the processing liquid toward an upper surface of the substrate W held by the spin chuck 9. The processing liquid nozzle 5 is connected to a processing liquid piping 6 in which a processing liquid valve 7 and a flow rate control valve 8 are interposed.

When the processing liquid valve 7 is opened, the processing liquid is supplied from the processing liquid piping 6 to the processing liquid nozzle 5 at a flow rate corresponding to an opening degree of the flow rate control valve 8, and discharged downward from the processing liquid nozzle 5 toward the upper surface of the substrate W. The processing liquid is, for example, pure water (deionized water). The processing liquid may be a rinse liquid other than pure water, may be a chemical liquid, or may be a liquid organic solvent such as IPA. A plurality of types of processing liquids may be successively supplied from one or more nozzles to the substrate W.

The spin chuck 9 includes a disk-shaped spin base 10 that is held horizontally, the plurality of chuck pins 11 that horizontally hold the substrate W above the spin base 10, and a chuck opening/closing mechanism that opens/closes the plurality of chuck pins 11. The spin chuck 9 further includes a spin shaft 15 extending downward from a central portion of the spin base 10 along the rotation axis A1, and a spin motor 16 that rotates the spin base 10 and the plurality of chuck pins 11 about the rotation axis A1 by rotating the spin shaft 15.

As shown in FIG. 2, the spin base 10 includes a horizontal circular upper surface 10a having an outer diameter greater than that of the substrate W. The chuck pins 11 are arranged in an outer periphery portion of the spin base 10, and project upward from the upper surface 10a of the spin base 10. The plurality of chuck pins 11 are arranged and spaced in the circumferential direction. The chuck pins 11 are rotatably held by the spin base 10.

As shown in FIG. 1, the spin motor 16 is arranged below the spin base 10. The spin chuck 9 further includes a housing 17 that houses the spin motor 16. The housing 17 includes a cylindrical peripheral wall 17a surrounding the spin motor 16, and an annular upper wall 17b extending inward from an upper end of the peripheral wall 17a. The spin shaft 15 is surrounded by the upper wall 17b of the housing 17.

Each of the chuck pins 11 includes a supporting portion 13 that supports the substrate W, a gripping portion 12 to be pressed against a bevel portion of the substrate W, and a base portion 14 that turns about the vertical pin turning axis A2 with respect to the spin base 10 together with the supporting portion 13 and the gripping portion 12. The chuck pin 11 can turn about the pin turning axis A2 with respect to the spin base 10 between the closing position where the gripping portion 12 is pressed against the bevel portion of the substrate W (position of the chuck pin 11 on the left side in FIG. 1) and the opening position where the gripping portion 12 is separated from the bevel portion of the substrate W (position of the chuck pin 11 on the right side in FIG. 1).

The supporting portion 13 and the gripping portion 12 are disposed above the upper surface 10a of the spin base 10. The base portion 14 passes through the outer periphery portion of the spin base 10 in the up and down direction. The gripping portion 12 has a columnar shape extending in the up and down direction. The supporting portion 13 defines an oblique surface extending upward toward the gripping portion 12. The gripping portion 12 is eccentric with respect to the pin turning axis A2. When the base portion 14 turns about the pin turning axis A2, a distance from the gripping portion 12 to the rotation axis A1 is increased/decreased.

The plurality of supporting portions 13 horizontally support the substrate W by contact between the supporting portions 13 and a lower surface of the substrate W when the chuck pins 11 are arranged at the opening position, that is, when the gripping portions 12 are separated from the bevel portion of the substrate W. When the chuck pins 11 are moved from the opening position to the closing position in a state where the substrate W is supported by the plurality of supporting portions 13, the gripping portions 12 come close to the bevel portion of the substrate W with the bevel portion of the substrate W being guided upward along the supporting portions 13. When the chuck pins 11 reach the closing position, the gripping portions 12 are pressed against the bevel portion of the substrate W. Thereby, the substrate W is gripped by the plurality of gripping portions 12.

The chuck opening/closing mechanism includes a plurality of driven magnets 18 respectively attached to the plurality of chuck pins 11, a plurality of closing drive magnets 19 respectively corresponding to the plurality of driven magnets 18, a first opening drive magnet 21 corresponding to the plurality of driven magnets 18, and a second opening drive magnet 22 corresponding to the plurality of driven magnets 18.

The closing drive magnets 19 are magnets that forms a magnetic field to place the chuck pins 11 at the closing position. The first opening drive magnet 21 and the second opening drive magnet 22 are magnets that form magnetic fields to place the chuck pins 11 at the closing position. Both the driven magnets 18 and the closing drive magnets 19 are permanent magnets. The first opening drive magnet 21 may be a permanent magnet or may be an electromagnet. The same is applied to the second opening drive magnet 22.

Each of the closing drive magnets 19 is fixed to the spin base 10 via a magnet cover 20. A horizontal distance from the pin turning axis A2 to the closing drive magnet 19 is constant irrespective of rotation angles of the spin base 10 and the chuck pins 11. Meanwhile, the first opening drive magnet 21 can be vertically moved between an upper position serving as a proximal position where the chuck pins 11 are placed at the opening position and a lower position serving as a separation position where the chuck pins 11 are placed at the opening position. The same is applied to the second opening drive magnet 22. Opening/closing of the chuck pins 11 are switched in accordance with the positions of the first opening drive magnet 21 and the second opening drive magnet 22.

The driven magnets 18 are arranged below the spin base 10. Each of the driven magnets 18 is rotated about the pin turning axis A2 together with the chuck pin 11. The driven magnet 18 and the closing drive magnet 19 are arranged in the magnet cover 20 attached to the spin base 10. The driven magnet 18 can be rotated about the pin turning axis A2 with respect to the magnet cover 20. The closing drive magnet 19 is fixed to the magnet cover 20. The closing drive magnet 19 is arranged on the outer side of the pin turning axis A2. The magnet cover 20 and the closing drive magnet 19 are rotated about the rotation axis A1 together with the spin base 10.

The first opening drive magnet 21 and the second opening drive magnet 22 are arranged on the inner side of the pin turning axis A2. The first opening drive magnet 21 and the second opening drive magnet 22 are arranged around the rotation axis A1. The first opening drive magnet 21 and the second opening drive magnet 22 are arranged in the housing 17. The first opening drive magnet 21 and the second opening drive magnet 22 are isolated from the driven magnets 18 by the housing 17 and the magnet covers 20. Even when the spin base 10 is rotated, the first opening drive magnet 21 and the second opening drive magnet 22 are not rotated but stay at the same positions.

The first opening drive magnet 21 is formed to have such size that only one chuck pin 11 is placed at the opening position. The second opening drive magnet 22 is formed to have such size that the remaining chuck pins 11 are placed at the opening position. As shown in FIG. 2, the first opening drive magnet 21 and the second opening drive magnet 22 are arranged on the same circumference having center placed on the rotation axis A1. The second opening drive magnet 22 has, for example, a C shape surrounding the rotation axis A1 in a plan view, and the first opening drive magnet 21 has, for example, an arc shape closing an opening portion of the C-shaped second opening drive magnet 22 in a plan view. The shapes of the first opening drive magnet 21 and the second opening drive magnet 22 are not limited to these.

As shown in FIG. 1, the chuck opening/closing mechanism includes a first magnet elevating/lowering mechanism 23 that vertically elevates and lowers the first opening drive magnet 21 between the upper position and the lower position, and a second magnet elevating/lowering mechanism 24 that vertically elevates and lowers the second opening drive magnet 22 between the upper position and the lower position. The first magnet elevating/lowering mechanism 23 and the second magnet elevating/lowering mechanism 24 are arranged in the housing 17. The first magnet elevating/lowering mechanism 23 includes, for example, an air cylinder or an electric motor serving as an actuator. The same is applied to the second magnet elevating/lowering mechanism 24.

When both the first opening drive magnet 21 and the second opening drive magnet 22 are arranged at the upper position, all the chuck pins 11 are arranged at the opening position. When both the first opening drive magnet 21 and the second opening drive magnet 22 are arranged at the lower position, all the chuck pins 11 are arranged at the closing position. When the first opening drive magnet 21 is arranged at the upper position and the second opening drive magnet 22 is arranged at the lower position, only one chuck pin 11 is arranged at the opening position and the remaining chuck pins 11 are arranged at the closing position.

When the substrate W is rotated, and also when the first opening drive magnet 21 is arranged at the upper position and the second opening drive magnet 22 is arranged at the lower position, the chuck pin 11 arranged at the opening position by the magnetic field which is formed by the first opening drive magnet 21 is successively switched in the circumferential direction. That is, the chuck pins 11 are moved from the closing position to the opening position and returned from the opening position to the closing position while the chuck pins make one rotation about the rotation axis A1.

When the substrate W is rotated, the plurality of chuck pins 11 pass through an annular region surrounding the substrate W. As shown in FIG. 2, the annular region includes a first region R1 and a second region R2 arranged in the circumferential direction. When the first opening drive magnet 21 is arranged at the upper position and the second opening drive magnet 22 is arranged at the lower position, the chuck pin 11 placed in the arc-shaped first region R1 is arranged at the opening position, and the remaining chuck pins 11 placed in the C-shaped second region R2 are arranged at the closing position.

As shown in FIG. 1, the processing unit 2 includes a brush 31 to be pressed against the substrate W, a brush arm 35 that holds the brush 31, a brush movement mechanism 36 that moves the brush 31 by moving the brush arm 35, and a pressing force changing mechanism 39 that changes pressing force of the brush 31 against the substrate W. The pressing force changing mechanism 39 is arranged in the brush arm 35. The processing unit 2 may include a brush rotation mechanism that rotates the brush 31 about the vertical brush 31 rotation axis A1 with respect to the brush arm 35 in the brush arm 35.

The brush 31 is held by a brush holder 32 arranged above the brush 31. The brush holder 32 is attached to a holder attachment portion 33 arranged above the brush holder 32. The holder attachment portion 33 is supported by a support shaft 34 extending upward from the holder attachment portion 33. The support shaft 34 projects downward from the brush arm 35. In a case where the brush rotation mechanism is included in the brush arm 35, the brush rotation mechanism rotates the brush 31 about an axis passing through the brush 31 by rotating the support shaft 34 about the center line thereof.

The brush 31 is an elastically deformable sponge brush made of synthetic resin such as PVA (polyvinyl alcohol). The brush 31 projects downward from the brush holder 32. The brush 31 includes a cleaning surface 31a arranged on the lower side of the brush holder 32. The cleaning surface 31a faces the upper surface of the substrate W in the up and down direction. The cleaning surface 31a is smaller than the substrate W in a plan view.

As described below, when the substrate W is scrub-cleansed, the cleaning surface 31a is pressed against the upper surface of the rotating substrate W. When the brush 31 is pressed against the substrate W, the cleaning surface 31a comes into close contact with the substrate W by elastic deformation of the brush 31. The cleaning surface 31a may be a flat surface in parallel with the upper surface of the substrate W or may be a hemispherical surface projecting downward in a free state where the brush 31 is not pressed against the substrate W. In a case where the cleaning surface 31a has a circular shape, a diameter of the cleaning surface 31a is, for example, 20 mm. However, size of the cleaning surface 31a is not limited to this.

The brush movement mechanism 36 includes a brush horizontal driving mechanism 37 that horizontally moves the brush arm 35, and a brush vertical driving mechanism 38 that vertically moves the brush arm 35. FIG. 1 shows an example in which the brush horizontal driving mechanism 37 is a brush turning mechanism that turns the brush arm 35 about the vertical brush turning axis A3 placed around the spin chuck 9. The brush horizontal driving mechanism 37 may be a brush sliding mechanism that horizontally moves the brush arm 35 in parallel.

The brush movement mechanism 36 moves the brush 31 to a plurality of positions by moving the brush arm 35. The plurality of positions include a standby position where the brush 31 is placed around the spin chuck 9 in a plan view, a central position where the brush 31 is in contact with center of the upper surface of the substrate W (position of the brush 31 shown by a double-chain line in FIG. 2), an outer periphery position where the brush 31 is in contact with an outer periphery portion of the upper surface of the substrate W (position of the brush 31 shown in FIG. 3A), and a bevel region cleaning position where the brush 31 is in contact with an inclined portion of the upper surface of the substrate W (position of the brush 31 shown in FIG. 3B).

Figure 3A:
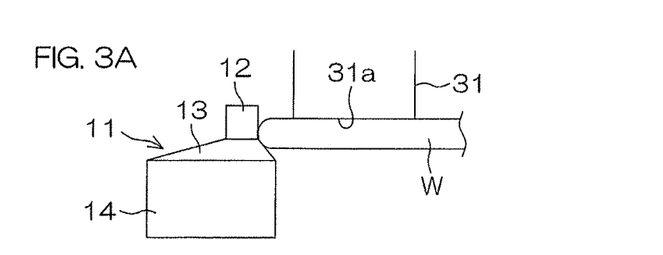
FIG. 3A is a schematic view showing a positional relationship between a chuck pin and a brush and shows a state where all the chuck pins are placed at a closing position and the brush is placed at an outer periphery position.
Figure 3B:
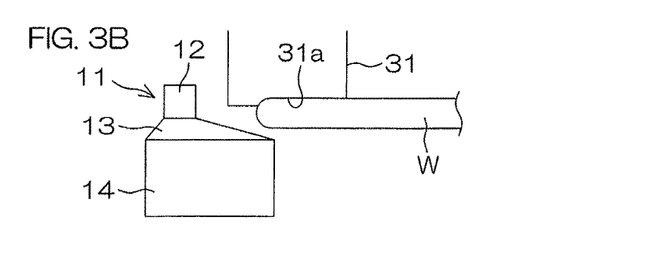
FIG. 3B is a schematic view showing a positional relationship between the chuck pin and the brush and shows a state where only one chuck pin is placed at an opening position and the brush is placed at a bevel region cleaning position.
Figure 4:
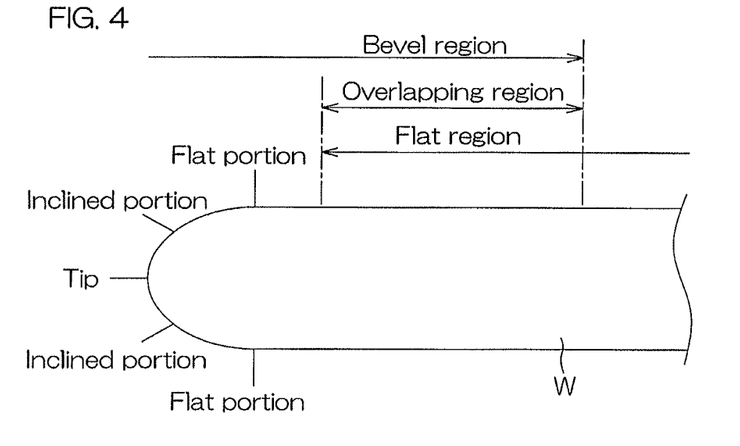
FIG. 4 is an enlarged view for illustrating a bevel portion of a substrate.

FIGS. 3A to 3B are schematic views showing positional relationships between the chuck pin 11 and the brush 31. FIG. 3A shows a state where all the chuck pins 11 are placed at the closing position and the brush 31 is placed at the outer periphery position. FIG. 3B shows a state where only one chuck pin 11 is placed at the opening position and the brush 31 is placed at the bevel region cleaning position. FIG. 4 is an enlarged view for illustrating the bevel portion of the substrate W.

As shown in FIG. 4, the upper surface of the substrate W includes a circular flat portion which is horizontal and flat, and the annular inclined portion extending obliquely downward and outward from an outer end of the flat portion of the upper surface. Similarly, the lower surface of the substrate W includes a circular flat portion which is horizontal and flat, and an annular inclined portion extending obliquely upward and outward from an outer end of the flat portion of the lower surface. The inclined portions of the upper surface and the lower surface are inclined with respect to the flat portions of the upper surface and the lower surface. An annular tip of the substrate W extends from an outer end of the inclined portion of the upper surface to an outer end of the inclined portion of the lower surface.

The bevel portion (outer periphery portion) of the substrate W is a portion including the inclined portion of the upper surface, the tip, and the inclined portion of the lower surface. FIG. 4 shows an example in which the bevel portion of the substrate W has a parabolic section. The bevel portion of the substrate W is not limited to the parabolic section but may have a trapezoidal section. That is, each of the inclined portion of the upper surface, the tip, and the inclined portion of the lower surface is not limited to an arc section but may have a straight section. In a case where the upper surface of the substrate W is a front surface corresponding to a device forming surface, portion of the flat portion of the upper surface corresponds to a device forming region. A non-device forming region is an annular region around the device forming region in the upper surface of the substrate W.

The central position is a position where the brush 31 is in contact with the center of the upper surface of the substrate W. As shown in FIG. 3A, the outer periphery position is a position where the brush 31 is in contact with the flat portion of the upper surface of the substrate W and an outer border of a contact region between the substrate W and the brush 31 is placed in the flat portion of the upper surface of the substrate W. As shown in FIG. 3B, the bevel region cleaning position is a position where the brush 31 is in contact with both the inclined portion and the flat portion of the upper surface of the substrate W and an inner border of the contact region between the substrate W and the brush 31 is placed in the flat portion of the upper surface of the substrate W. As clear from viewing FIGS. 3A and 3B, an outer portion of the outer periphery position overlaps with an inner portion of the bevel region cleaning position. The outer periphery position and the bevel region cleaning position are positions on the outer side of the central position.

A region ranging from the outer border of the contact region between the substrate W and the brush 31 when the substrate W is rotated and the brush 31 is placed at the outer periphery position to the center of the upper surface of the substrate W is a circular flat region (see FIG. 4). The contact region of the brush 31 with respect to the substrate W when the substrate W is rotated and the brush 31 is placed at the bevel region cleaning position is an annular bevel region including the inclined portion and the flat portion of the upper surface (see FIG. 4). As shown in FIG. 4, an outer periphery portion of the flat region and an inner periphery portion of the bevel region overlap with each other. The annular overlapping region is an overlapping region. The outer periphery position corresponds to an overlapping region cleaning position where the cleaning surface 31a of the brush 31 is in contact with the overlapping region and not in contact with the plurality of chuck pins 11 which are in contact with the bevel portion of the substrate W.

As shown in FIG. 3A, at the outer periphery position, the brush 31 does not project outward from the tip of the substrate W. Therefore, even when all the chuck pins 11 are placed at the closing position and the brush 31 is arranged at the outer periphery position, the brush 31 is not in contact with the chuck pins 11. Meanwhile, as shown in FIG. 3B, at the bevel region cleaning position, the brush 31 projects outward from the tip of the substrate W. Therefore, when the brush 31 is arranged at the bevel region cleaning position, in order to avoid contact between the brush 31 and the chuck pins 11, the first opening drive magnet 21 is placed at the upper position and only one chuck pin 11 is placed at the opening position.

Next, processing examples of the substrate W (first and second processing examples) performed by the processing unit 2 will be described.

The following actions are executed by the controller 3 controlling the substrate processing apparatus 1 on the basis of a recipe showing processing conditions and processing procedures for the substrate W. The substrate W to be processed may be a substrate W with which a pattern is exposed on a front surface or may be a substrate W with which no pattern is exposed.

Figure 5A:
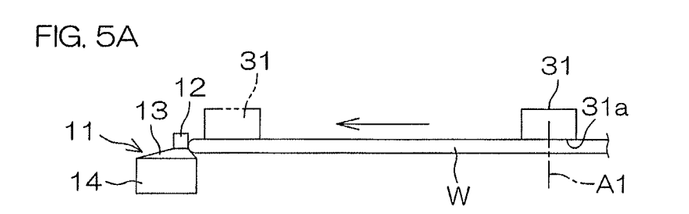
FIG. 5A is a schematic view for illustrating a first processing example of the substrate performed by the processing unit and shows a state where the brush is moved from a central position to the outer periphery position.
Figure 5B:
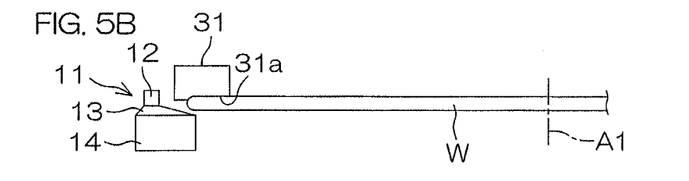
FIG. 5B is a schematic view for illustrating the first processing example of the substrate performed by the processing unit and shows a state where the brush is placed at a bevel region cleaning position.
Figure 5C:
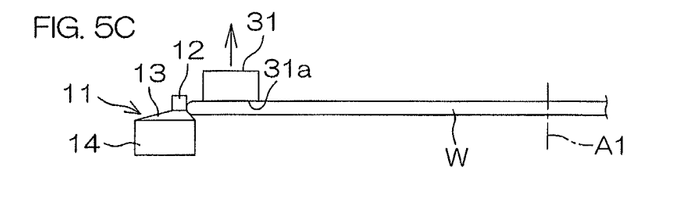
FIG. 5C is a schematic view for illustrating the first processing example of the substrate performed by the processing unit and shows a state where the brush is placed at the outer periphery position and then retracted upward from the outer periphery position.
Figure 6:
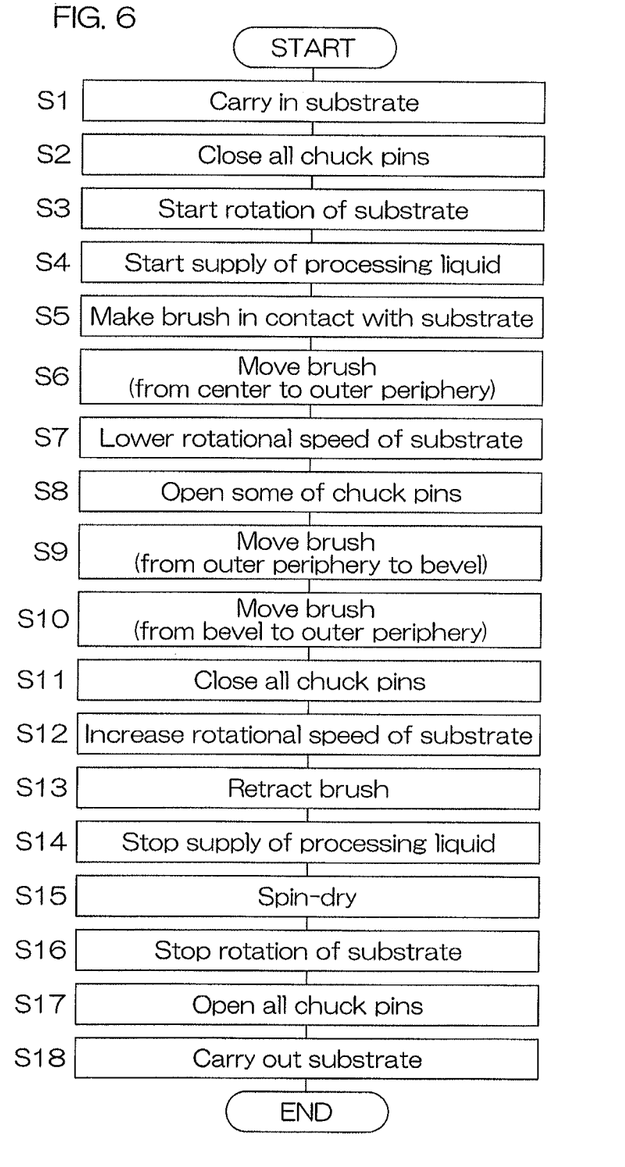
FIG. 6 is a flowchart showing a flow of the first processing example.

FIGS. 5A to 5C are schematic views for illustrating the first processing example. FIG. 6 is a flowchart showing a flow of the first processing example.

When the substrate W is processed by the processing unit 2, in order to place all the chuck pins 11 at the opening position, both the first opening drive magnet 21 and the second opening drive magnet 22 are arranged at the upper position. In this state, the transfer robot (not shown) carries the substrate W on a hand into the chamber 4, and places the substrate W whose front surface faces the lower side onto the spin base 10 (Step S1). Thereby, the substrate W is supported by the supporting portions 13 of the plurality of chuck pins 11. After that, both the first opening drive magnet 21 and the second opening drive magnet 22 are arranged at the upper position. Thereby, all the chuck pins 11 are moved from the opening position to the closing position, and the substrate W is gripped by the gripping portions 12 of the plurality of chuck pins 11 (Step S2).

After the substrate W is gripped by the plurality of chuck pins 11, the spin motor 16 starts rotation of the substrate W (Step S3). Thereby, the substrate W is rotated at a first rotational speed. After that, the processing liquid valve 7 is opened, and the pure water as one example of the processing liquid is discharged from the processing liquid nozzle 5.

Thereby, supply of the pure water to the upper surface of the substrate W is started (Step S4). The pure water discharged from the processing liquid nozzle 5 lands on the upper surface of the rotating substrate W and flows outward along the upper surface of the substrate W. Thereby, a liquid film of the pure water covering the entire upper surface of the substrate W is formed.

Next, the brush movement mechanism 36 moves the brush 31 from the standby position to the central position. Thereby, the brush 31 is pressed against the upper surface of the substrate W with pressing force specified in the recipe, and the cleaning surface 31a of the brush 31 is in contact with the center of the upper surface of the rotating substrate W (Step S5). After that, as shown in FIG. 5A, the brush movement mechanism 36 moves the brush 31 from the central position to the outer periphery position (Step S6). Thereby, the brush 31 is rubbed onto the entire flat region, so that the entire flat region is scrub-cleansed.

After the brush 31 reaches the outer periphery position, the spin motor 16 lowers the rotational speed of the substrate W to a second rotational speed which is smaller than the first rotational speed (Step S7). After that, the first magnet elevating/lowering mechanism 23 moves the first opening drive magnet 21 from the lower position to the upper position. At this time, the second opening drive magnet 22 is placed at the lower position. Therefore, in a state where the gripping portion 12 of one chuck pin 11 is separated from the bevel portion of the substrate W and the gripping portions 12 of the remaining chuck pins 11 are in contact with the bevel portion of the substrate W, all the chuck pins 11 are rotated about the rotation axis A1 (Step S8). As described above, the chuck pin 11 separated from the substrate W is successively switched by the rotation of the plurality of chuck pins 11.

After the first magnet elevating/lowering mechanism 23 is arranged at the upper position, the brush movement mechanism 36 moves the brush 31 outward from the outer periphery position to the bevel region cleaning position while making the brush in contact with the substrate W (Step S9). When the brush 31 is moved to the bevel region cleaning position, portion of the brush 31 comes close to the original shape and is closely attached to the inclined portion of the upper surface of the substrate W. Thereby, as shown in FIG. 5B, the brush 31 is in contact with both the inclined portion and the flat portion of the upper surface of the substrate W. Therefore, the brush 31 is rubbed onto the entire bevel region including both the inclined portion and the flat portion of the upper surface of the substrate W, so that the entire bevel region is scrub-cleansed.

After the brush 31 is moved to the bevel region cleaning position, the brush movement mechanism 36 moves the brush 31 inward from the bevel region cleaning position to the outer periphery position while making the brush in contact with the substrate W (Step S10). After that, the first magnet elevating/lowering mechanism 23 moves the first opening drive magnet 21 from the upper position to the lower position. Thereby, the gripping portions 12 of all the chuck pins 11 are in contact with the bevel portion of the substrate W (Step S11). After that, the spin motor 16 increases the rotational speed of the substrate W to a third rotational speed which is greater than the second rotational speed (Step S12). Thereby, the brush 31 is rubbed onto the entire overlapping region of the substrate W rotated at the third rotational speed, so that the entire overlapping region is scrub-cleansed.

After the rotational speed of the substrate W is increased to the third rotational speed, the brush movement mechanism 36 moves the brush 31 upward from the outer periphery position (Step S13). Thereby, the brush 31 is separated from the substrate W. After that, the brush movement mechanism 36 moves the brush 31 to the standby position. The processing liquid valve 7 is closed after the brush 31 is separated from the substrate W. Thereby, the supply of the pure water to the substrate W is stopped (Step S14). After that, the spin motor 16 increases the rotational speed of the substrate W to a dry speed (for example, a few thousand rpm) which is greater than any of the first to third rotational speeds. Thereby, the pure water adhered to the substrate W is drained off to a periphery of the substrate W, so that the substrate W is dried (Step S15). After the substrate W is dried, the spin motor 16 stops the rotation of the substrate W (Step S16).

After the rotation of the substrate W is stopped, the first magnet elevating/lowering mechanism 23 and the second magnet elevating/lowering mechanism 24 move both the first opening drive magnet 21 and the second opening drive magnet 22 from the lower position to the upper position. Thereby, the gripping portions 12 of all the chuck pins 11 are separated from the bevel portion of the substrate W, and the substrate W is supported by the supporting portions 13 of all the chuck pins 11 (Step S17). After that, the transfer robot (not shown) raises the substrate W on the spin chuck 9 with the hand, and carries the substrate W out of the chamber 4 together with the hand (Step S18). Thereby, the already-processed substrate W is carried out of the chamber 4.

Next, the second processing example of the substrate W performed by the processing unit 2 will be described.

Figure 7A:
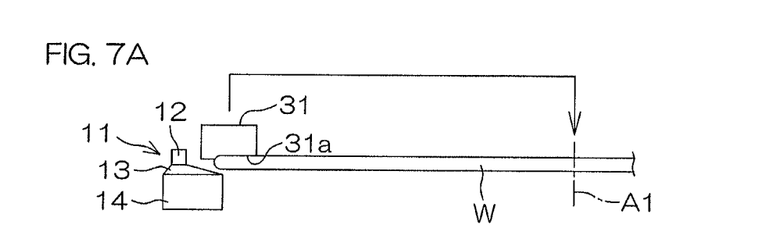
FIG. 7A is a schematic view for illustrating a second processing example of the substrate performed by the processing unit and shows a state where the brush is arranged at the bevel region cleaning position and then moved to a position above the central position.
Figure 7B:
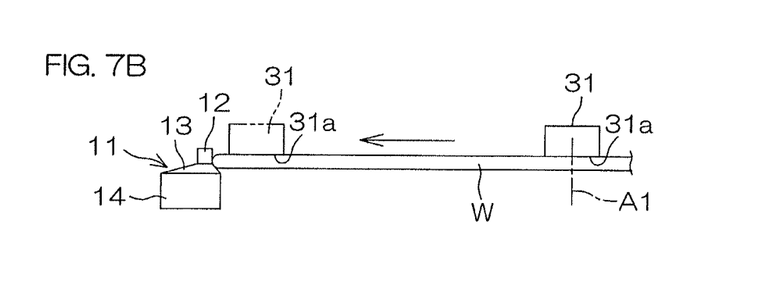
FIG. 7B is a schematic view for illustrating the second processing example of the substrate performed by the processing unit and shows a state where the brush is moved from the central position to the outer periphery position.
Figure 8:
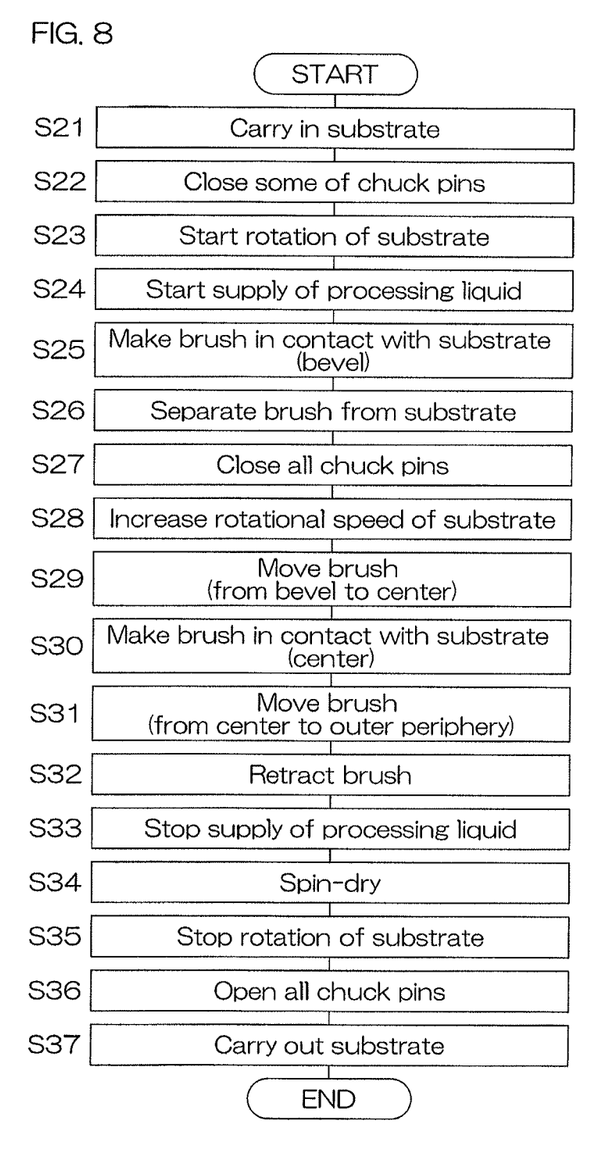
FIG. 8 is a flowchart showing a flow of the second processing example.

FIGS. 7A to 7B are schematic views for illustrating the second processing example. FIG. 8 is a flowchart showing a flow of the second processing example.

When the substrate W is processed by the processing unit 2, in order to place all the chuck pins 11 at the opening position, both the first opening drive magnet 21 and the second opening drive magnet 22 are arranged at the upper position. In this state, the transfer robot (not shown) carries the substrate W on the hand into the chamber 4, and places the substrate W whose front surface faces the lower side onto the spin base 10 (Step S21). Thereby, the substrate W is supported by the supporting portions 13 of the plurality of chuck pins 11. After that, only the second opening drive magnet 22 is arranged at the upper position. Thereby, all the remaining chuck pins 11 except one chuck pin are moved from the opening position to the closing position, and the substrate W is gripped by the gripping portions 12 of the plurality of chuck pins 11 (Step S22).

After the substrate W is gripped by the plurality of chuck pins 11, the spin motor 16 starts the rotation of the substrate W (Step S23). Thereby, the substrate W is rotated at the second rotational speed. After that, the processing liquid valve 7 is opened, and the pure water as one example of the processing liquid is discharged from the processing liquid nozzle 5. Thereby, the supply of the pure water to the upper surface of the substrate W is started (Step S24). The pure water discharged from the processing liquid nozzle 5 lands on the upper surface of the rotating substrate W and flows outward along the upper surface of the substrate W. Thereby, a liquid film of the pure water covering the entire upper surface of the substrate W is formed.

Next, the brush movement mechanism 36 moves the brush 31 from the standby position to the bevel region cleaning position. Thereby, as shown in FIG. 7A, the brush 31 is pressed against the substrate W with pressing force specified in the recipe, and is in contact with both the inclined portion and the flat portion of the upper surface of the substrate W (Step S25). Therefore, the brush 31 is rubbed onto the entire bevel region including both the inclined portion and the flat portion of the upper surface of the substrate W. The particles removed from the substrate W by the brush 31 are discharged from the substrate W together with the pure water flowing outward on the substrate W. Thereby, the entire bevel region is scrub-cleansed.

As shown by the arrow in FIG. 7A, after the brush 31 is moved to the bevel region cleaning position, the brush movement mechanism 36 moves the brush 31 upward from the bevel region cleaning position. Thereby, the brush 31 is separated from the substrate W (Step S26). After that, the first magnet elevating/lowering mechanism 23 moves the first opening drive magnet 21 from the upper position to the lower position. Thereby, the gripping portions 12 of all the chuck pins 11 are in contact with the bevel portion of the substrate W (Step S27). At this time, since the brush 31 is retracted upward, the brush 31 is not in contact with any chuck pins 11. After the first opening drive magnet 21 is moved to the lower position, the spin motor 16 increases the rotational speed of the substrate W to the first rotational speed which is greater than the second rotational speed (Step S28).

The brush movement mechanism 36 moves the brush 31 separated from the substrate W inward to a position above the central position during a period until all the chuck pins 11 are arranged at a closing position, and the rotational speed of the substrate W is increased to the first rotational speed (Step S29). After that, the brush movement mechanism 36 moves the brush 31 to the central position and makes the brush 31 in contact with the upper surface of the substrate W rotated at the first rotational speed (Step S30). Successively, as shown in FIG. 7B, the brush movement mechanism 36 moves the brush 31 from the central position to the outer periphery position (Step S31). Thereby, the brush 31 is rubbed onto the entire flat region, so that the entire flat region including the overlapping region is scrub-cleansed.

After the brush 31 reaches the outer periphery position, the brush movement mechanism 36 moves the brush 31 upward from the outer periphery position (Step S32). Thereby, the brush 31 is separated from the substrate W. After that, the brush movement mechanism 36 moves the brush 31 to the standby position. The processing liquid valve 7 is closed after the brush 31 is separated from the substrate W. Thereby, the supply of the pure water to the substrate W is stopped (Step S33). After that, the spin motor 16 increases the rotational speed of the substrate W to the dry speed (for example, a few thousand rpm) which is greater than any of the first to second rotational speeds. Thereby, the pure water adhered to the substrate W is drained off to the periphery of the substrate W, so that the substrate W is dried (Step S34). After the substrate W is dried, the spin motor 16 stops the rotation of the substrate W (Step S35).

After the rotation of the substrate W is stopped, the first magnet elevating/lowering mechanism 23 and the second magnet elevating/lowering mechanism 24 move both the first opening drive magnet 21 and the second opening drive magnet 22 from the lower position to the upper position. Thereby, the gripping portions 12 of all the chuck pins 11 are separated from the bevel portion of the substrate W, and the substrate W is supported by the supporting portions 13 of all the chuck pins 11 (Step S36). After that, the transfer robot (not shown) raises the substrate W on the spin chuck 9 with the hand, and carries the substrate W out of the chamber 4 together with the hand (Step S37). Thereby, the already-processed substrate W is carried out of the chamber 4.

As described above, in the first processing example of the preferred embodiment, all the chuck pins 11 are rotated while making all the chuck pins 11 in contact with the bevel portion of the substrate W. Thereby, the substrate W is rotated about the rotation axis A1 at the first rotational speed. The cleaning surface 31a of the brush 31 is pressed against the upper surface of the rotating substrate W. In this state, the brush 31 is moved along the upper surface of the substrate W within a range where the brush 31 is not in contact with the plurality of chuck pins 11. Thereby, the brush 31 is rubbed onto the circular flat region ranging from the center of the upper surface of the substrate W to a position around the center, so that the flat region is scrub-cleansed.

Next, in a state where three or more of the chuck pins 11 are in contact with the bevel portion of the substrate W, the remaining chuck pin 11 is separated from the substrate W. The rotational speed of the substrate W is lowered from the first rotational speed to the second rotational speed. In this state, the brush 31 is arranged at the bevel region cleaning position where the cleaning surface 31a of the brush 31 is in contact with both the annular overlapping region corresponding to an outer peripheral portion of the flat region and the inclined portion of the upper surface of the substrate W. Thereby, the bevel region including both the overlapping region and the inclined portion of the upper surface of the substrate W is scrub-cleansed. That is, the cleaning surface 31a of the brush 31 is pressed not only against the flat region but also against the bevel region.

Next, all the chuck pins 11 are pressed against the bevel portion of the substrate W. The rotational speed of the substrate W is increased to the third rotational speed which is greater than the second rotational speed. In this state, the brush 31 is arranged at the outer periphery position where the cleaning surface 31a of the brush 31 is in contact with the overlapping region and not in contact with the plurality of chuck pins 11 which are in contact with the bevel portion of the substrate W. Since the third rotational speed is greater than the second rotational speed, relative speed of the substrate W and the brush 31 is increased. Therefore, the particles are more reliably removed from the overlapping region.

The overlapping region is a portion of the flat region and a portion of the bevel region. When the flat region is cleaned, the overlapping region is cleaned. Meanwhile, when the bevel region is cleaned, the particles are spread in the overlapping region. This is because the rotational speed of the substrate W at the time of cleaning the bevel region is low and the particles are accumulated and spread between the substrate W and the brush 31. Therefore, the particles can be removed from the overlapping region by cleaning the overlapping region while rotating the substrate W at high speed after the bevel region is cleaned. Thereby, cleanliness of the substrate W can be enhanced. In fact, it was confirmed that in the first processing example, in comparison to a case where the overlapping region is not cleaned after the flat region and the bevel region are cleaned, the number of the particles remaining on the substrate W after drying is reduced by about 85%.

In the second processing example of the preferred embodiment, all the chuck pins 11 are rotated while making three or more of the chuck pins 11 in contact with the bevel portion of the substrate W and separating the remaining chuck pin 11 from the bevel portion of the substrate W. Thereby, the substrate W is rotated about the rotation axis A1 at the second rotational speed. In this state, the brush 31 is arranged at the bevel region cleaning position where the cleaning surface 31a of the brush 31 is in contact with both the inclined portion of the upper surface of the substrate W and the annular overlapping region on the inner side of the inclined portion. Thereby, the brush 31 is rubbed onto the bevel region including both the overlapping region and the inclined portion of the upper surface of the substrate W, so that the bevel region is scrub-cleansed.

Next, all the chuck pins 11 are pressed against the bevel portion of the substrate W. The rotational speed of the substrate W is increased to the first rotational speed which is greater than the second rotational speed. In this state, the brush 31 is moved between the central position where the cleaning surface 31a of the brush 31 is in contact with the center of the upper surface of the substrate W and the outer periphery position where the cleaning surface 31a of the brush 31 is in contact with the overlapping region and not in contact with the plurality of chuck pins 11 which are in contact with the bevel portion of the substrate W. Thereby, the circular flat region ranging from the center of the upper surface of the substrate W to the position around the center is scrub-cleansed. That is, the cleaning surface 31a of the brush 31 is pressed not only against the bevel region but also against the flat region.

The overlapping region is a portion of the flat region and a portion of the bevel region. When the bevel region is cleaned after the flat region is cleaned, the particles remain in the overlapping region. This is because the rotational speed of the substrate W at the time of cleaning the bevel region is low and the particles are accumulated and spread between the substrate W and the brush 31. Therefore, the particles can be removed from the overlapping region by cleaning the flat region while rotating the substrate W at high speed after the bevel region is cleaned. Thereby, the cleanliness of the substrate W can be enhanced. Further, since the particles spread in the overlapping region can be removed while cleaning the entire flat region, a cleaning time can be shortened.

In the preferred embodiment, the brush 31 is moved from the bevel region cleaning position to the outer periphery position without moving the brush 31 to a position on the inner side of the outer periphery position corresponding to the overlapping region cleaning position (position of the brush 31 shown in FIG. 3A). When the bevel region is cleaned, the particles accumulated between the substrate W and the brush 31 are spread in the inclined portion of the upper surface of the substrate W and the overlapping region but not easily spread to the region on the inner side of the overlapping region. In the preferred embodiment, the contact region between the substrate W and the brush 31 is not moved on the inner side of the overlapping region but the brush 31 is separated from the substrate W after the brush is directly moved from the bevel region cleaning position to the outer periphery position. Therefore, only the region contaminated at the time of cleaning the bevel region (overlapping region) and the vicinity of the region can be efficiently cleaned. Further, in comparison to a case where the entire flat region is cleaned again after the bevel region is cleaned, throughput can be increased.

In the preferred embodiment, when the flat region is cleaned, the brush 31 is moved only in the direction separating from the rotation axis A1 of the substrate W while making the brush 31 in contact with the upper surface of the rotating substrate W. The particles on the substrate W are urged to move outward along the substrate W by movement of the brush 31. Therefore, the particles can be efficiently removed from the substrate W, so that the cleanliness of the substrate W can be further enhanced.

Other Preferred Embodiments

The present invention is not restricted to the contents of the preferred embodiments described above and various modifications are possible within the scope of the present invention.

For example, the brush 31 is not limited to a sponge brush but may be a brush including a plurality of fibers made of synthetic resin.

In the first and second processing examples described above, the case where the substrate W is held by the spin chuck 9 in a face-down state where the front surface faces downward is described. However, the substrate W may be held by the spin chuck 9 in a face-up state where the front surface faces upward.

In the first and second processing examples described above, the case where the brush 31 is moved outward from the central position to the outer periphery position is described. However, the brush 31 may be moved inward. Specifically, the brush 31 may be moved from the outer periphery position to the central position while making the brush in contact with the substrate W, or the brush 31 may move back and forth once or more between the central position and the outer periphery position while making the brush in contact with the substrate W.

In the first processing example described above, the case where the brush 31 is directly moved from the bevel region cleaning position to the outer periphery position and then moved upward from the outer periphery position is described. However, after the bevel region is cleaned, a scanning process of moving the brush 31 from the central position to the outer periphery position while making the brush in contact with the substrate W may be performed once or more. In this case, the brush 31 is preferably returned to the central position in a state where the brush 31 is separated from the substrate W.

In the first processing example described above, details of cleaning conditions of the substrate W at the time of cleaning the overlapping region are not described. However, the cleaning conditions at the time of cleaning the overlapping region may be the same as, or different from cleaning conditions at the time of cleaning the flat region. Specifically, at least one of the rotational speed of the substrate W, the pressing force of the brush 31 against the substrate W, a contact duration in which the brush 31 is in contact with the substrate W, and the flow rate of the pure water supplied to the substrate W at the time of cleaning the overlapping region may be weakened more than that at the time of cleaning the flat region.

Figure 9:
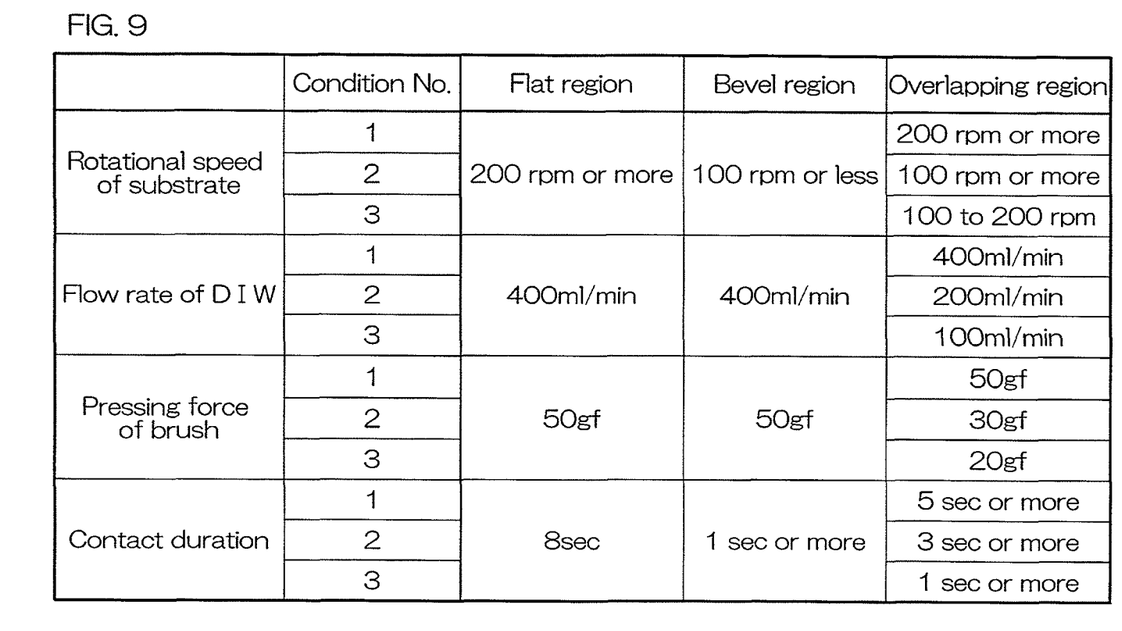
FIG. 9 is a table for illustrating cleaning conditions of the substrate.

FIG. 9 is a table for illustrating the cleaning conditions of the substrate W. For example, when the flat region is cleaned under Condition No. 1, the rotational speed of the substrate W is 200 rpm or more, the flow rate of the pure water supplied to the substrate W is 400 ml/min, the pressing force of the brush 31 against the substrate W is 50 gf, and the duration in which the brush 31 is in contact with the flat region is 8 sec. The same is applied to the other conditions.

When the bevel region is cleaned, the particles accumulated between the substrate W and the brush 31 are spread in the overlapping region. The particles spread in the overlapping region are particles removed from the substrate W by the brush 31, the particles normally having weaker adhesion force to the substrate W than that of the particles attached to the substrate W before cleaning. Therefore, even when the cleaning conditions including the rotational speed of the substrate W are weakened, the particles can be removed from the overlapping region. Thereby, the cleanliness of the substrate W can be efficiently enhanced.

In the preferred embodiments described above, the case where the outer periphery position and the overlapping region cleaning position are the same position is described. However, the outer periphery position and the overlapping region cleaning position may be different positions from each other.

In the preferred embodiments described above, the case where the upper surface of the substrate W is scrub-cleansed is described. However, the lower surface of the substrate W may be scrub-cleansed. In this case, a spin chuck which is the same one as in PATENT DOCUMENT 1 may be used.

In the preferred embodiments described above, the case where the gripping portion 12 and the supporting portion 13 are included in the same chuck pin 11 is described. However, the supporting portion 13 may be omitted from the chuck pin 11. In this case, the plurality of supporting portions 13 may be arranged at positions different from the plurality of chuck pins 11.

In the preferred embodiments described above, the case where the first opening drive magnet 21 opens and closes one chuck pin 11 and the second opening drive magnet 22 opens and closes the remaining chuck pins 11 is described. However, the first opening drive magnet 21 may open and close the plurality of chuck pins 11.

In the preferred embodiments described above, the case where the chuck pins 11 are placed at the closing position by magnetic force acting between the driven magnets 18 and the closing drive magnets 19 is described. However, the chuck pins 11 may be placed at the closing position by members other than magnets such as springs.

Two or more of any of the arrangements described above may be combined. Two or more of any of the steps described above may be combined.

The present application corresponds to Japanese Patent Application No. 2015-166099 filed on Aug. 25, 2015 in the Japan Patent Office, and the entire disclosure of this application is incorporated herein by reference. While preferred embodiments of the present invention have been described in detail, it should be understood that these embodiments are merely illustrative of the technical principles of the present invention but not limitative of the invention. The spirit and scope of the present invention are to be limited only by the appended claims.

DESCRIPTION OF THE REFERENCE NUMERALS

1: Substrate processing apparatus
2: Processing unit
3: Controller
4: Chamber
5: Processing liquid nozzle
6: Processing liquid piping
7: Processing liquid valve
8: Flow control valve
9: Spin chuck
10: Spin base
10a: Upper surface of spin base
11: Chuck pin
12: Gripping portion
13: Supporting portion
14: Base portion
15: Spin shaft
16: Spin motor
17: Housing
17a: Peripheral wall of housing
17b: Upper wall of housing
18: Driven magnet
19: Closing drive magnet
20: Magnet cover
21: First opening drive magnet
22: Second opening drive magnet
23: First magnet elevating/lowering mechanism
24: Second magnet elevating/lowering mechanism
31: Brush
31a: Cleaning surface of brush
32: Brush holder
33: Holder attachment portion
34: Support shaft
35: Brush arm
36: Brush movement mechanism
37: Brush horizontal driving mechanism
38: Brush vertical driving mechanism
39: Pressing force changing mechanism
A1: Rotation axis
A2: Pin turning axis
A3: Brush turning axis
R1: First region
R2: Second region
W: Substrate

What is claimed is:

1. A substrate processing method comprising:
a first substrate rotation process of rotating a substrate in a horizontal posture at a first rotational speed by rotating a plurality of chuck pins about a vertical rotation axis passing through the substrate while making all the plurality of chuck pins in contact with a bevel portion of the substrate;
a flat region cleaning process of cleaning a circular flat region ranging from a center of a principal surface of the substrate to a position around the center by moving a brush within a range where the brush is not in contact with the plurality of chuck pins which are in contact with the bevel portion of the substrate while making a cleaning surface of the brush in contact with the principal surface of the substrate in parallel with the first substrate rotation process;
a second substrate rotation process of rotating the substrate in a horizontal posture at a second rotational speed which is smaller than the first rotational speed by rotating the plurality of chuck pins about the rotation axis while making three or more of the plurality of chuck pins in contact with the bevel portion of the substrate and separating the remaining chuck pin from the bevel portion of the substrate after the first substrate rotation process;
a bevel region cleaning process of cleaning a bevel region including both an annular overlapping region corresponding to an outer peripheral portion of the flat region and an inclined portion of the principal surface of the substrate by arranging the brush at a bevel region cleaning position which is a positon on the inner side of the chuck pin which has been separated from the bevel portion of the substrate and where the cleaning surface of the brush is in contact with both the overlapping region and the inclined portion of the principal surface of the substrate in parallel with the second substrate rotation process;
a third substrate rotation process of rotating the substrate in a horizontal posture at a third rotational speed which is greater than the second rotational speed by rotating the plurality of chuck pins about the rotation axis while making all the plurality of chuck pins in contact with the bevel portion of the substrate after the second substrate rotation process; and an overlapping region cleaning process of cleaning the overlapping region by arranging the brush at an overlapping region cleaning position where the cleaning surface of the brush is in contact with the overlapping region and not in contact with the plurality of chuck pins which are in contact with the bevel portion of the substrate in parallel with the third substrate rotation process.

2. The substrate processing method according to claim 1, wherein the overlapping region cleaning process includes a moving process of moving the brush from the bevel region cleaning position to the overlapping region cleaning position without moving the brush to a position on the inner side of the overlapping region cleaning position, and a separation process of separating the brush from the substrate by moving the brush upward or downward from the overlapping region cleaning position.

3. The substrate processing method according to claim 1, wherein the flat region cleaning process includes a scanning process of moving the brush only in a direction separating from the rotation axis while making the brush in contact with the principal surface of the substrate.

4. The substrate processing method according to claim 1, wherein at least one of the rotational speed of the substrate, pressing force of the brush against the substrate, and a contact duration in which the brush is in contact with the substrate at the time of executing the overlapping region cleaning process is reduced more than that at the time of the flat region cleaning process.

5. A substrate processing method comprising:
 a second substrate rotation process of rotating a substrate in a horizontal posture at a second rotational speed by rotating a plurality of chuck pins about a vertical rotation axis passing through the substrate while making three or more of the plurality of chuck pins in contact with a bevel portion of the substrate and separating the remaining chuck pin from the bevel portion of the substrate;
 a bevel region cleaning process of cleaning a bevel region including both an inclined portion of a principal surface of the substrate and an annular overlapping region on the inner side of the inclined portion by arranging a brush at a bevel region cleaning position which is a position on the inner side of the chuck pin which has been separated from the bevel portion of the substrate and where a cleaning surface of the brush is in contact with both the inclined portion of the principal surface of the substrate and the overlapping region;
 a first substrate rotation process of rotating the substrate in a horizontal posture at a first rotational speed which is greater than the second rotational speed by rotating the plurality of chuck pins about the rotation axis while making all the plurality of chuck pins in contact with the bevel portion of the substrate after the second substrate rotation process; and
 a flat region cleaning process of cleaning a circular flat region ranging from a center of the principal surface of the substrate to the overlapping region by moving the brush between a central position where the cleaning surface of the brush is in contact with the center of the principal surface of the substrate and an outer periphery position where the cleaning surface of the brush is in contact with the overlapping region and not in contact with the plurality of chuck pins which are in contact with the bevel portion of the substrate in parallel with the first substrate rotation process.

6. A substrate processing apparatus comprising:
 a spin chuck including a plurality of chuck pins to be arranged around a substrate, a chuck opening/closing mechanism that moves three or more of the plurality of chuck pins and the remaining chuck pin independently between a closing position where the chuck pin is in contact with a bevel portion of the substrate and an opening position where the chuck pin is separated from the bevel portion of the substrate, and a spin motor that rotates the plurality of chuck pins about a vertical rotation axis passing through the substrate;
 a brush including a cleaning surface to be pressed against the substrate horizontally held by the spin chuck;
 a brush movement mechanism that moves the brush; and
 a controller that is configured and programmed to execute the substrate processing method according to claim 1 by controlling the spin chuck and the brush movement mechanism.

\* \* \* \* \*